United States Patent [19]

Wolgemuth et al.

[11] Patent Number: 5,453,911
[45] Date of Patent: Sep. 26, 1995

[54] DEVICE FOR COOLING POWER ELECTRONICS

[75] Inventors: James H. Wolgemuth, Rochester Hills; Joseph Madak, Madison Heights, both of Mich.

[73] Assignee: General Motors Corporation, Detroit, Mich.

[21] Appl. No.: 197,989

[22] Filed: Feb. 17, 1994

[51] Int. Cl.⁶ .................................... H05K 7/20
[52] U.S. Cl. .................. 361/689; 165/80.4; 165/908; 257/714; 361/699
[58] Field of Search ................... 361/689, 699, 361/704, 707, 709, 717, 718, 722, 690, 692; 62/414, 418, 259.2; 165/80.3, 80.4, 104.33, 908; 257/706, 707, 712, 713, 714, 723, 724

[56] References Cited

U.S. PATENT DOCUMENTS

| | | | |
|---|---|---|---|
| 3,788,393 | 1/1974 | Plizak | 165/109 |
| 4,879,632 | 11/1989 | Yamamoto | 361/699 |
| 5,005,640 | 4/1991 | Lapinski | 165/170 |
| 5,021,924 | 6/1991 | Kieda | 361/385 |
| 5,111,280 | 5/1992 | Iverson | 361/699 |
| 5,166,775 | 11/1992 | Bartilson | 361/383 |
| 5,170,320 | 12/1992 | Pease | 361/690 |
| 5,183,104 | 2/1993 | Novotny | 165/104.33 |
| 5,361,188 | 11/1994 | Kondou | 361/695 |

*Primary Examiner*—Gerald P. Tolin
*Attorney, Agent, or Firm*—Cary W. Brooks

[57] ABSTRACT

A heatsink or cold plate is provided with which power electronic components mounted to a surface of the cold plate can be cooled with a cooling fluid flowing through the cold plate. The cold plate generally consists of a relatively planar structure through which one or more passages are formed for directing the cooling fluid through the cold plate. The passages direct the cooling fluid to recesses in the surface of the cold plate which are enclosed by the power electronic components. As such, cooling of the power electronic components is achieved by directly impinging the cooling fluid at their lower surfaces, preferably at an acute angle, such that enhanced heat transfer characteristics result.

12 Claims, 2 Drawing Sheets

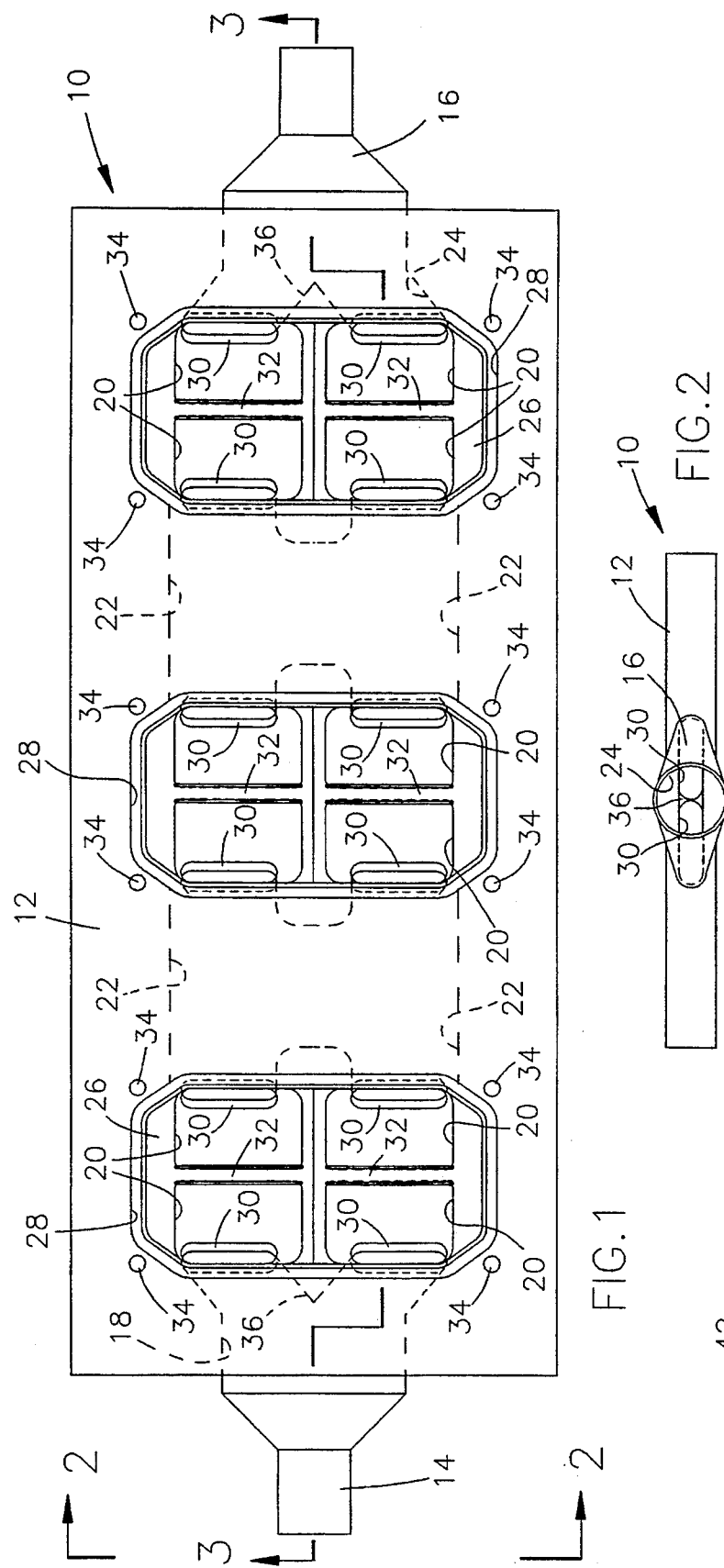
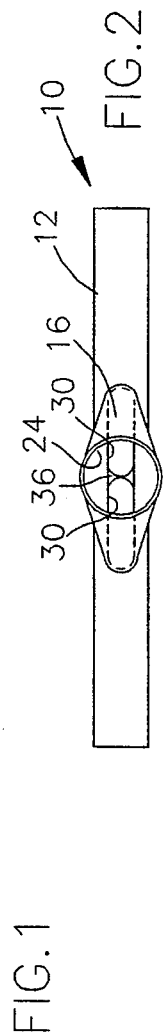
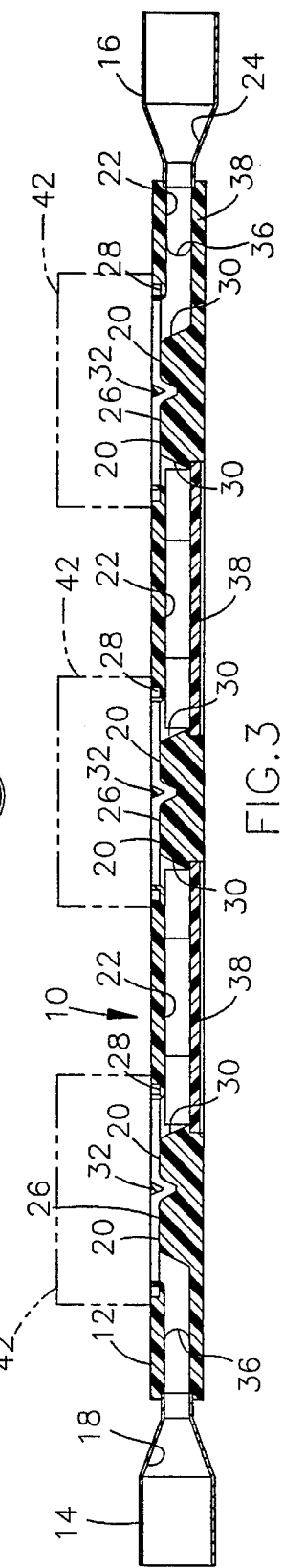

DEVICE FOR COOLING POWER ELECTRONICS

The present invention generally relates to methods for cooling power electronic devices which are mounted on a plate or board housed within an enclosure. More particularly, this invention relates to a method by which a power electronic device is cooled by directly impinging a cooling fluid against the base plate of the device, in which the cooling fluid flows to and from the device through the plate to which the device is mounted.

BACKGROUND OF THE INVENTION

Power electronic devices such as insulated gate bipolar transistors (IGBTs) and silicon-controlled rectifiers (SCRs) are typically cooled by mounting the devices within a housing which is secured to a heatsink or "cold plate". Cold plates are typically formed from a material which is highly thermally conductive, such as aluminum or copper, enabling the cold plate to readily conduct heat generated by the devices away from the devices and to the environment. Generally, heat is conducted by the cold plate to a structure which is designed to transfer the heat to the surrounding air or a liquid via conduction and convection.

A disadvantage with prior art cold plates is that heat transfer from a power electronic device is diminished to some degree because the heat must travel through the base plate of the housing in which the device is enclosed, and across the interface between the base plate and the cold plate before it reaches the cold plate. Heat transfer across the base plate-cold plate interface is highly dependent on the intimacy of the mating surfaces, which in turn is dependent on the flatness of the mating surfaces and the contact pressure generated by the fastener which secures the device to the cold plate. As a result, localized hot spots can occur in the base plate and cold plate, and the power electronic device is subject to higher operating temperatures. To mitigate this effect, larger and thicker base plates are often utilized to better distribute the heat across the base plate-cold plate interface. Thicker cold plates may also be necessary to provide a greater heatsink mass, particularly where more than one power electronic device is mounted to a single cold plate. Unfortunately, the additional weight resulting from increased base plate and cold plate thicknesses is often undesirable, particularly for applications within the automotive and aerospace industries.

Transfer of heat to a fluid flowing through the cold plate is also known. Again, a thermally conductive metal cold blare is typically used, but with one or more passages being formed within the cold plate. As before, heat is conducted from the devices and to the environment via a cooling fluid flowing through the passages. Though enhanced heat transfer is possible with fluid-cooled could plates, such cold plates share the same disadvantage noted above with the more conventional prior art cold plates. Specifically, heat transfer from the power electronic device is diminished because heat must travel through the base plate of the device and across the interface between the base plate and the cold plate before it reaches the cold plate. Consequently, power electronic devices cooled by fluid-cooled cold plates are also subject to higher operating temperatures.

Thus, it would be desirable to provide a method for promoting the heat transfer between power electronic devices and the environment, such that cooler operating temperatures can be achieved for the devices. It would be particularly advantageous to exploit the enhanced cooling capability made possible by fluid cooling a cold plate, yet enhance the overall heat transfer characteristics wit]hour incurring additional weight. Furthermore, it would be advantageous if heat transfer could be selectively enhanced for one or more electronic devices which are enclosed in a housing mounted to the cold plate, so as to enable better control of the operating temperatures of the devices.

SUMMARY OF THE INVENTION

It is an object of this invention to provide a fluid-cooled cold plate for cooling power electronic components which are mounted to the cold plate, in which cooling is achieved by a cooling fluid flowing through the cold plate.

It is a further object of this invention that such a cold plate make possible a method by which heat generated by the power electronic components is primarily transferred directly to the cooling fluid by impinging the cooling fluid directly on the base plates of the power electronic components.

It is still a further object of this invention that such a cold plate utilize nozzles and deflectors which are able to selectively enhance the cooling capability for the power electronic components by minimizing the boundary layer at the base plates of the components.

In accordance with a preferred embodiment of this invention, these and other objects and advantages are accomplished as follows.

According to the present invention, there is provided a cooling device for cooling one or more power electronic components in which one or more power electronic devices are enclosed. In particular, the cooling device is configured to allow the power electronic components to be mounted to the cooling device, such that the cooling device is able to direct a cooling fluid directly against a surface of each power electronic component. The device is generally composed of a cold plate which forms one or more mounting surfaces to which the power electronic components are mounted. As is conventional, the power electronic components include a base plate by which they are secured to the cold plate by any suitable manner, such as a threaded fastener. The cold plate has one or more recesses formed in its mounting surfaces, and the power electronic components are each secured to the cold plate such that their base plates cover or enclose each of the recesses. One or more passages are formed in the cold plate for transporting a suitable cooling fluid to and from the recesses.

As a result of the cold plate being configured as described above, the cooling fluid flowing through the cold plate impinges directly on the base plates of the power electronic components, such that the cooling fluid is able to transfer heat directly from the power electronic component to the environment. As such, heat transfer from the power electronic components does not rely upon heat being transferred to the cooling fluid through the base plate-to-cold plate interface, such that the inherent resistance to heat transfer created by this interface is avoided. Furthermore, because heat is transferred directly to the cooling fluid, the heat transfer characteristics can actually be enhanced by making the base plates of the power electronic components thinner, contrary to accepted practices of the prior art in which thicker base plates are employed to better distribute the heat generated by the power electronic components. In addition, because it is unnecessary to conduct heat through the cold plate itself, the cold plate can be formed from a material which is not highly thermally conductive, such as a plastic. As such, the overall weight of the cold plate and power electronic component assembly can be significantly reduced. As an additional benefit, a cold plate formed from a plastic or another dielectric material is able to provide enhanced protection for an electronic device from radio frequency interference (RFI) and electromagnetic interference (EMI), as compared to a conventional metal cold plate.

The cold plate of this invention also makes possible the use of a nozzle upstream of each recess, such that the cooling fluid can be directed to impinge the base plate of any given power electronic component at an acute angle. In doing so, the relatively stagnant boundary layer inherently formed by the cooling fluid along the surface of the base plate of the power electronic component is significantly reduced, thereby further promoting heat transfer from the component to the cooling fluid. Additional enhancements for promoting the cooling effect of the cooling fluid on the power electronic component are also made possible with this invention, such as placing deflectors across the recesses so as to divert the fluid away from the base plate of a power electronic component, and subsequently redirecting the fluid toward the base surface of the same component or an adjacent component. In doing so, potential hot spots can be specifically addressed by ensuring that the cooling fluid impinges the base plate of each power electronic component, regardless of where the component is mounted on the cold plate and, to a significant degree, regardless of the number of power electronic devices housed within the component.

Notably, it has been determined that an enhanced cooling effect is achieved with this invention with only a minimal pressure drop through the cold plate, contrary to prior art fluid-cooled cold plates in which a significant pressure drop is typically required in order to achieve a suitable cooling effect. Consequently, the required capacity and size of a pump used to pump the cooling fluid through the cold plate of this invention can be significantly less than pumps conventionally required to achieve an equivalent cooling capability for prior art fluid-cooled cold plates. Such an advantage is particularly important in automotive applications.

Accordingly, a particularly advantageous feature of this invention is that the heat transfer characteristics for a power electronic component-cold plate assembly can be enhanced. Resistance to heat transfer is reduced by minimizing the thicknesses of the base plates through which heat must be conducted, eliminating reliance on the base plate-cold plate interface for heat conduction, and minimizing the boundary layer effect at the cooling fluid-base plate interface. Another advantage of this invention is that the weight of the power electronic component-cold plate assembly can be minimized by reducing the thicknesses of the base plates and cold plate, and by permitting the cold plate to be formed from a relatively lightweight material such as a plastic, which simultaneously offers enhanced RFI and EMI protection. In addition, the advantages of this invention can be readily adopted by those skilled in the art to address potential high temperature areas on the cold plate, thereby enhancing the reliability of the power electronic devices. Finally, a relatively low pressure pump can be used to pump the cooling fluid through the cold plate, yet achieve a satisfactory cooling effect.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein:

FIG. 1 shows a plan view of a cold plate in accordance with this invention;

FIG. 2 shows an end view of the cold plate of FIG. 1;

FIG. 3 is a cross-sectional view of the cold plate of FIG. 1 along line 3—3.

DETAILED DESCRIPTION OF THE INVENTION

Figure 4:
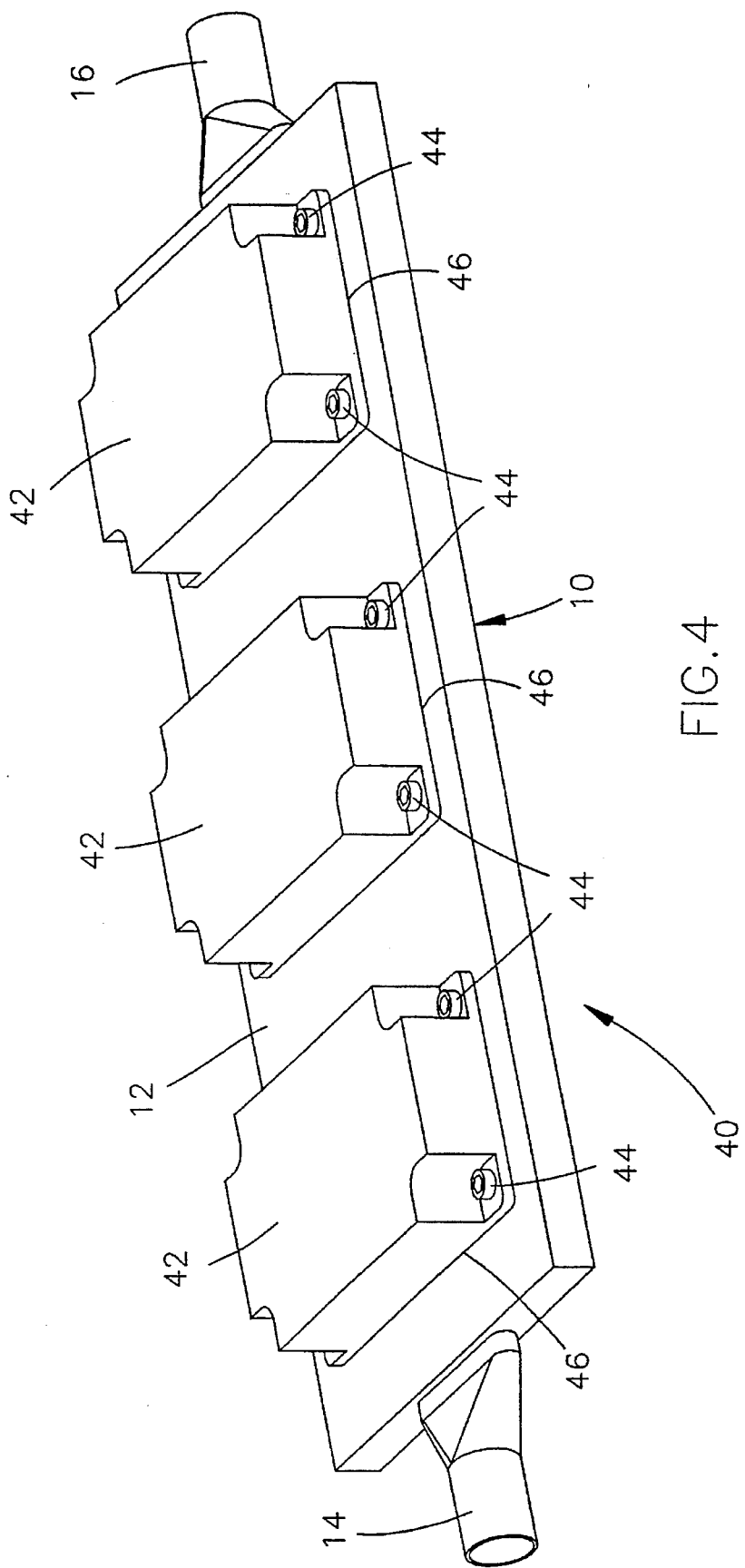
FIG. 4 ms a perspective view of the cold plate of FIG. 1, illustrating a mounting arrangement for power electronic components on the cold plate.

A heatsink or cold plate is provided with which power electronic components mounted to a surface of the cold plate can be cooled with a cooling fluid flowing through the cold plate. The cold plate generally consists of a relatively planar structure through which one or more passages are formed for directing the cooling fluid through the cold plate. The passages direct the cooling fluid to recesses in the surface of the cold plate which are enclosed by the power electronic components. As such, cooling of the power electronic components is achieved by directly impinging cooling flow at their lower surfaces, such that enhanced heat transfer characteristics result.

FIGS. 1 through 3 illustrate a cold plate 10 in accordance with this invention. As illustrated, the cold plate 10 is composed of a plate 12 having a generally planar surface, an inlet port 14 and an outlet port 16. The plate 12 can be formed from any material which enables the plate 12 to exhibit mechanical and physical properties which are suitable for a particular application. For example, the plate 12 could be formed from a relatively lightweight structural engineering plastic. The inlet and outlet ports 14 and 16 form inlet and outlet passages 18 and 24, respectively, for a pair of parallel passages 20 which extend through the plate 12. Flow dividers 36 are located in the inlet and outlet passages 18 and 24 in order to separate and later reunite the passages 20 as they traverse through the plate 12. As such, a cooling fluid, such as water or an aqueous solution with a depressed freezing point, entering the inlet port 14 will flow through the inlet passage 18, through both of the passages 20, and eventually exit the plate 12 through the outlet port 16.

As shown, internal cavities 22 are formed within the plate 12 at which the passages 20 are reunited. Generally, such internal cavities facilitate manufacturing of the plate 12, though an additional benefit is allowing the cooling fluid to intermix at intermediate points along the flow path through the plate 12. Consequently, a more uniform temperature can be achieved for the cooling fluid as it progresses through the plate 12. As best seen in FIG. 3, each of the internal cavities 22 are enclosed from a back surface of the plate 12 with a cover plate 38, which may be welded to the plate 12 or otherwise secured to the plate 12 in order to form a fluid-tight seal. While two passages 20 are shown in FIG. 1, those skilled in the art will recognize that a single passage 20 or numerous passages 20, parallel or otherwise, could also be utilized, depending on the required configuration for the plate 12 and the number of power electronic components which must be cooled.

Formed in the surface of the plate 12 are a pair of recessed cavities 26 which are preferably recessed slightly below the surface of the plate 12. An O-ring groove 28 circumscribes each of the recessed cavities 26, and threaded holes 34 are provided at the perimeter of the O-ring grooves 28. As shown in FIG. 4, the threaded holes 34 permit the base plate 46 of a power electronic component 42 to be secured to the surface with a corresponding number of threaded fasteners When a power electronic component 42 is appropriately mounted to the plate 12, an O-ring (not shown) residing in the O-ring groove 28 serves to seal the interface between the base plate 46 and the plate 12, such that the base plate 46 of each power electronic component 42 completely covers and effectively seals one of the recessed cavities 25, as shown. Alternatively, it is foreseeable that the use of O-rings and fasteners could be eliminated by welding or adhering the base plates 46 and the housing portion of the power electronic components 42 to the plate 12, or by integrally forming the base plates 46 and housing portions with the plate 12.

With reference again to FIGS. 1 through 3, the recessed cavities 26 are connected in series by each of the passages 20. As shown, each passage 20 adjoins a recessed cavity 26 with a nozzle 30. As those skilled in the art will recognize, the cross-sectional area of each nozzle 30 can be sized to advantageously alter the flow velocity and characteristics of the cooling fluid immediately downstream of the nozzle 30, such that the heat transfer characteristics within the downstream regions of the cold plate 12 can be tailored. As best seen in FIG. 3, the nozzles 30 divert the flow of the cooling fluid from the passages 20 toward the surface of the plate 12 where the recessed cavities 26 are formed. As such, the nozzles 30 direct the cooling fluid at an angle to the surface of the plate 12. Preferably the angle between the flow path through the nozzles 30 and the surface of the plate 12, hereinafter referred to as the impingement angle, is an acute angle. By directing the cooling fluid at an acute angle to the surface, the cooling fluid will impinge the base plate 46 of a power electronic component 42 mounted to the plate 12 such that the boundary layer at the base plate 46 will tend to be scrubbed away.

As those skilled in the art will recognize, the boundary layer is a transition region composed of the layer of fluid immediately adjacent the surface over which the fluid flows. This layer is characterized by a flow velocity of zero at the surface, from which the velocity increases until it is equal to the stream velocity. Because the boundary layer is relatively stagnant, the transfer of heat to the fluid at the boundary layer is limited primarily to conduction, instead of the more efficient mode of convection. In accordance with this invention, as a result of the boundary layer being reduced by the scrubbing action of the cooling fluid, the heat transfer film coefficient ("h") for the cooling fluid will be increased, corresponding to enhanced heat transfer between the base plate 46 and the cooling fluid.

As shown, the impingement angle is approximately 65 degrees to the surface of the plate 12, though significantly greater or lesser impingement angles could be utilized and still achieve a suitable degree of reduction in the thickness of the boundary layer at the base plates 46 of the power electronic components 42. It is worth noting that an impingement angle of approximately 90 degrees would not generally be as effective in reducing the boundary layer, except for in the relatively small surface area immediately surrounding the point of impingement by the fluid. Similarly, it is believed that an impingement angle of roughly zero degrees would be effective in circumstances where the length of the surface to be cooled (in the direction of flow) is not greater than approximately the width of the corresponding nozzle 30, so as to prevent the formation of a boundary layer. It is believed that near optimum cooling performance can be achieved with an impingement angle of between about 45 and 75 degrees, though it is foreseeable that suitable results can be achieved with impingement angles which are greatly outside of this range, including the range of impingement angles between about 0 and 90 degrees.

Within the recessed cavities 26, the passages 20 broaden, as can be seen in FIG. 1, but also become significantly more shallow, as shown in FIG. 3. Extending widthwise across each of the passages 20 and within the recessed cavities 26 is a deflector 32. As best seen in FIG. 3, the deflectors 32 serve to divert the flow of the cooling fluid away from the surface of the plate 12, and thereafter permit their corresponding passages 20 to redirect the cooling fluid toward the surface at an acute angle, similar to that for the nozzles 30. Thereafter, the cooling fluid reenters a nozzle 30 which directs the cooling fluid toward either one of the internal cavities 22 or the outlet passage 24. The deflectors 32 are disposed adjacent, and preferably abut against, the lower surfaces of their corresponding base plates 46 as shown in FIG. 3. As a result, the deflectors 32 serve to interrupt the flow of the cooling fluid across the surfaces of the base plates 46, so as to prevent the boundary layer from becoming thicker, which would cause a drop in heat transfer efficiency. In addition, the deflectors 32 redivert the cooling fluid toward the surfaces of the base plates 46, such that the boundary layer downstream of each deflector 32 is also reduced. As a result, a single power electronic component 42 can have two or more regions of its base plate 46 being scrubbed by the cooling flow, including an upstream region being impinged by cooling fluid flowing through a nozzle 30, and one or more downstream regions impinged by cooling fluid flowing past one or more deflectors 32. Consequently, a power electronic component 42 can house two or more power electronic devices (not shown) which are positioned within the power electronic component 42 over the upstream and downstream regions of the base plate 46, such that each device is able to benefit from essentially the same scrubbing action in order to maximize its heat transfer characteristics.

Because the cold plate 10 of this invention enables the cooling fluid to impinge directly on the base plates 46 of the power electronic components 42 mounted to its surface, additional improvements in heat transfer are made possible. For example, the conventional requirement to uniformly distribute the heat across the surfaces of the base plates 46 by increasing the thicknesses of the base plates 46 is no longer necessary. Accordingly, thinner base plates 46 can be used, resulting in improved heat conduction through the base plates 46 and lower weight. Further improvements in heat transfer can be achieved by surface treating the base plates 46 so as to further increase the heat transfer film coefficient "h". For example, the lower surfaces of the base plates 46 could be roughened, sand blasted, vapor blasted or etched in a manner which would promote more turbulent flow over the base plates 46, thus improving heat transfer.

A heatsink assembly 40 is illustrated in FIG. 4, which employs the cold plate 10 of this invention, along with several power electronic components 42 mounted to the surface of the cold plate 10. In accordance with this invention, the heatsink assembly 40 offers significant advantages over heatsink assemblies known in the prior art. For example, the heat transfer characteristics for the heatsink assembly 40 are significantly enhanced by the manner in which the cooling fluid is allowed to impinge directly against the base plate 46 of each power electronic component 42. Resistance to heat transfer between the power electronic components 42 and the cooling fluid is significantly reduced by eliminating the base plate 46—cold plate 12 interface and by minimizing the boundary layer effect at the cooling fluid-base plate 46 interface. Because a uniform temperature distribution over the surface of each base plate 46 is not critical, the thicknesses of the base plates 46 can be significantly reduced, further promoting the conduction of heat from the power electronic components 42 to the cooling fluid.

Another advantage of this invention is that the weight of the heatsink assembly 40 can be minimized by reducing the thicknesses of the base plates 46 and cold plate 10, and by permitting the cold plate 10 to be formed from a relatively lightweight material, such as a plastic. The use of plastic as the material for the plate 12 is made possible because the plate 12 is not required to conduct heat, but is necessary only to provide structural support for the power electronic components 42 and to form the passages 20 and recessed cavities 26 which perform the cooling function for the power electronic components 42. As an additional benefit, the use of a plastic or other dielectric material of the cold plate 10 results in reduced radio frequency interference (RFI) and electromagnetic interference (EMI) as compared to conventional metal cold plates.

Still another advantage of this invention is that an enhanced cooling effect can be achieved with the cold plate 10 with a minimal pressure drop being sustained by the cooling fluid as it flows through the cold plate 10. Consequently, the required pressure for a fluid pump used to pump the cooling fluid through the cold plate 10 can be significantly less than pumps conventionally required to achieve an equivalent cooling capability for prior art fluid-cooled cold plates. Such a capability is particularly advantageous in automotive applications.

In additions, the advantages of this invention can be readily adopted by those skilled in the art to address potential high temperature areas on the base plates 46 or plate 12, thereby enhancing the reliability of the power electronic devices 42. In particular, flow velocities and characteristics within specific regions of the plate 12 can be tailored in order to improve heat transfer characteristics and improve the overall temperature profile across the surface of the cold plate 10. Finally, as those skilled in the art will recognize, numerous variations of the heatsink assembly 40 are possible with this invention. In particular, recessed cavities 26 could be formed on opposite surfaces of the plate 12, with the passages 12 being further divided in order to provide cooling flow through each recessed cavity 26. As such, power electronic components 42 could be mounted to both surfaces of the plate 12 and yet benefit from cooling flow made possible with this invention. The overall shape of the cold plate 12 could also be substantially altered and yet enable the cooling technique of this invention.

While our invention has been described in terms of a preferred embodiment, it is apparent that other forms could be adopted by one skilled in the art. For example, the size, number and shape of passages 20 and recessed cavities 26 could be modified, as well as the size and shape of the cold plate 10, different materials could be substituted for those suggested, and various types of heat generating devices could be cooled with the cold plate 10 of this invention under a wide variety of circumstances. Accordingly, the scope of our invention is to be limited only by the following claims.

The embodiments of the invention in which an exclusive property or privilege is claimed are defined as follows:

1. A cooling device comprising:

a plate having a surface defining a plane of the plate, the surface being adapted to support a power electronic component;

a recess formed in the surface of the plate;

means for securing the power electronic component to the plate, the securing means being adapted to position the power electronic component on the surface of the plate so as to enclose the recess with a base surface of the power electronic component;

a passage formed in the plate for transporting a fluid to and from the recess;

first means disposed in the passage for deflecting and diverting the fluid as the fluid flows from an upstream portion of the passage and into the recess so as to direct the fluid into the recess at an acute angle relative to the plane of the plate; and second means disposed in the passage for deflecting and diverting the fluid as the fluid flows from the recess into a downstream portion of the passage, so as to direct the fluid into the downstream portion of the passage at an angle from the plane of the plate.

2. A device as recited in claim 1 wherein the passage comprises a plurality of parallel passages through the plate.

3. A device as recited in claim 1 wherein the plate comprises a dielectric material.

4. A device as recited in claim 1 wherein the first deflecting and diverting means comprises a nozzle upstream of the recess such that the fluid is directed toward the plane of the plate at an acute angle which is sufficient to reduce the boundary layer within the recess at the plane of the plate.

5. A device as recited in claim 1 further comprising an obstacle disposed across the recess so as to deflect the fluid away from the plane of the plate, and subsequently permit the fluid to be redirected toward the plane of the plate.

6. A cooling device comprising:

a plate having a surface;

a power electronic component secured to the surface of the plate, the power electronic component having a base surface abutting the surface of the plate;

a recess formed in the plate beneath the power electronic component, such that the base surface of the power electronic component forms an interior surface of the recess;

a passage formed in the plate for transporting a fluid to and from the recess;

first means disposed in the passage for deflecting and diverting the fluid as the fluid flows from an upstream portion of the passage and into the recess so as to direct the fluid into the recess at an acute angle relative to the base surface of the power electronic component; and second means disposed in the passage for deflecting and diverting the fluid as the fluid flows from the recess into a downstream portion of the passage so as to direct the fluid into the downstream portion of the passage at an angle from the base surface of the power electronic component;

whereby the fluid impinges the base surface of the power electronic component such that the power electronic component transfers heat directly to the fluid without an intermediate thermal conductor therebetween.

7. A device as recited in claim 6 wherein the passage comprises a plurality of parallel passages through the plate.

8. A device as recited in claim 6 wherein the plate comprises a polymeric material.

9. A device as recited in claim 6 wherein the first deflecting and diverting means comprises a nozzle upstream of the recess such that the fluid impinges the base surface of the power electronic component at an acute angle to the plane of the base surface, the acute angle being sufficient to reduce the boundary layer within the recess at the base surface of the power electronic component, 10. A device as recited in claim 6 further comprising an obstacle disposed across the recess so as to deflect the fluid away from the base surface of the power electronic component, and subsequently permit the fluid to be redirected toward the base surface of the power electronic component, so as to enhance the cooling effect of the fluid on the power electronic component.

11. A device as recited in claim 6 further comprising means for securing the power electronic component to the surface of the plate, and wherein the recess is formed in the surface of the plate beneath the power electronic component such that the base surface of the power electronic component encloses the recess.

12. A device as recited in claim 6 further comprising:

a plurality of power electronic components mounted to the surface of the plate;

an inlet port;

an outlet port a plurality of recesses formed in the surface of the plate beneath the plurality of power electronic components, such that the base surface of each of the plurality of power electronic components encloses a corresponding one of the plurality of recesses; and a plurality of passages extending through the plate between the inlet port and the outlet port, the plurality of passages transporting the fluid from the inlet port, through the plurality of recesses, and to the outlet port.

* * * * *